United States Patent [19]

Tognoni

[11] Patent Number: 4,906,904
[45] Date of Patent: Mar. 6, 1990

[54] CATHODE RAY TUBE DEFLECTION CIRCUIT WITH SOLID STATE SWITCH

[75] Inventor: Keith I. Tognoni, Leominster, Mass.

[73] Assignee: Digital Equipment Corporation, Maynard, Mass.

[21] Appl. No.: 372,060

[22] Filed: Jun. 27, 1989

[51] Int. Cl.[4] .................. H01J 29/70; H01J 29/76
[52] U.S. Cl. ........................... 315/408; 315/397
[58] Field of Search .................. 315/408, 396, 397

[56] References Cited

U.S. PATENT DOCUMENTS

| | | | |
|---|---|---|---|
| 4,242,714 | 12/1980 | Yoshida et al. | 315/408 |
| 4,487,457 | 12/1984 | Janutka . | |
| 4,500,801 | 2/1985 | Janutka . | |
| 4,535,273 | 8/1985 | Midland | 315/397 |
| 4,556,825 | 12/1985 | Thomas . | |
| 4,580,063 | 4/1986 | Torelli et al. . | |
| 4,692,693 | 9/1987 | Tokunaga et al. . | |
| 4,751,408 | 6/1988 | Rambert . | |
| 4,777,387 | 10/1988 | Collins . | |

Primary Examiner—Theodore M. Blum
Attorney, Agent, or Firm—Nutter, McClennen & Fish

[57] ABSTRACT

A solid-state switch in a deflection circuit includes a plurality of field-effect transistors (Q7, Q8, and Q9) connected in series. Each of the transistors (Q7, Q8, and Q9) is part of a switching module (20, 22, and 24) in the form of a three-terminal transistor circuit. Two of the modules (20 and 22) are connected to a common gating terminal (12) solely by diodes (D6 and D7) oriented so as (a) to conduct current in the direction required to provide a turn-on signal for the transistors (Q7 and Q8) but (b) to isolate the common gating terminal (12) from the high voltages experienced by the transistors (Q7 and Q8) when they are in their non-conducting states.

7 Claims, 4 Drawing Sheets 4,906,904

CATHODE RAY TUBE DEFLECTION CIRCUIT WITH SOLID STATE SWITCH

BACKGROUND OF THE INVENTION

The present invention is directed to cathode-ray-tube flyback circuits and in particular to those of the type required by high-resolution displays.

In a cathode-ray tube (a "CRT"), the position of the electron beam on the screen is determined by the current that flows through deflection yokes. FIG. 1 is a simplified schematic diagram of the type of circuit typically employed to control yoke current. The yoke $L_y$ is shown connected to a fixed source voltage V+ at one end and through a switch S to ground at the other. A diode D and capacitor C are connected in parallel with the switch S. The drawing includes a conceptual diode $D_s$ to indicate that the switch S is a unidirectional electronic switch. A gating signal $V_g$ controls the state of the switch S.

FIGS. 2a-d illustrate the operation of this conventional circuit. The operation is cyclical, and FIGS. 2a-d enter the cycle at a time $t_0$ at which the gating signal assumes an actuation value $V_{on}$. FIG. 2a represents the value of the gating signal.

FIG. 2b depicts the yoke current. For reasons that will become apparent as the description proceeds, the current flow through the yoke is negative at time $t_0$; i.e., the current flows toward the positive source terminal. Diode D therefore conducts, clamping one end of the yoke $L_y$ to ground. Because a fixed voltage V+ is applied across the yoke $L_y$ at this time, the yoke current increases linearly, and the horizontal position of the beam accordingly moves across the CRT screen to produce the forward, visible trace. As FIG. 2b shows, the yoke current becomes positive at time $t_1$, so the yoke current stops flowing through the diode D and starts flowing through the switch S at that time.

At time $t_2$, the gating signal $V_g$ assumes a ground-level, disabling value, and the switch S responds after a delay by beginning to open at time $t_3$. As is illustrated by FIG. 2c, which depicts the switch current, the switch S is completely open after a delay $t_d$. This begins the horizontal retrace.

Specifically, the yoke current begins to flow through the capacitor C when the switch S opens. The voltage on capacitor C accordingly rises. FIG. 2d depicts the capacitor voltage. The capacitance of capacitor C is low enough that the voltage rise is rapid; the purpose of capacitor C is to reverse the yoke current during the horizontal retrace time, and it is preferable to keep the retrace time low.

The resulting waveform of the current through the yoke $L_y$ between times $t_3$ and $t_4$ is one-half cycle of a short-period sinusoid. When the yoke current becomes negative, the voltage on capacitor C decreases, reaching zero at time $t_4$, as FIG. 2d illustrates.

After the capacitor voltage reaches zero at time $t_4$, the diode D becomes forward biased, clamping the lower end of the yoke to ground and thereby causing a fixed voltage across the yoke. The yoke current therefore increases linearly from a negative value. During this linear increase, the gating signal $V_g$ returns to the activation value $V_{on}$ that it assumed at time $t_0$, and the cycle repeats.

The foregoing discussion is equally applicable both to conventional CRTs and to high-resolution CRTs. For high-resolution CRTs, however, the design constraints on circuit components are more stringent.

Increased CRT resolution means an increased number of horizontal scans for each vertical scan. Moreover, to avoid flicker, the vertical scan rate in higher-resolution displays is typically higher than that in conventional television. It is at least 60 Hz and preferably 66 Hz or even 80 Hz. The horizontal scan frequency is therefore much higher than the 15.75 kHz American television standard; it is typically at least 64 kHz and can exceed 100 kHz. The retrace time ($t_{fly}$) must therefore be shortened from the 11 microseconds common in conventional television to a value in the range of 1.5–3.0 microseconds. This means that the peak capacitor voltage—and thus the voltage that the electronic switch can withstand—must increase. Additionally, field-effect transistors ("FETs") are the transistors of choice for such applications, and, for a given chip size, the on resistances of FETs increase faster than the squares of their breakdown voltages. The resultant resistance can detract from the linearity of the yoke-current curve.

One solution to this problem has been to configure the switch as a plurality of transistors connected in series; the total voltage that such a switch can withstand is proportional to the number of transistors, and the total switch resistance increases only linearly with the required voltage. Although this approach has been followed with some success, a certain degree of switch complexity has heretofore resulted from the requirement that the different switch transistors, which are at widely different potentials in the off state, be controlled by a common gate signal.

FIG. 3 depicts a typical prior-art circuit that illustrates this complexity. A series combination of capacitors C1 and C2 embodies the current-reversing capacitor C of FIG. 1, while the switch corresponding to switch S of FIG. 1 includes transistors Q1 and Q2 as well as the remaining circuitry in FIG. 3, which enables transistors Q1 and Q2 to respond to a common gating signal.

As will be explained presently, a high signal at terminal 12 causes transistors Q1 and Q2 to conduct. The conduction of transistor Q2 completes a current path to ground from a supply node 14 through a resistor R1, a diode D1, and the parallel combination of a zener diode D2 and a capacitor C3. As a result, the capacitor C3 is charged to the zener voltage and can be thought of as acting as a voltage supply that imposes a voltage between "supply rails" 16 and 18.

The high signal at the common gating terminal 12 causes current to flow through resistor R2, diode D3, and resistor R3 and forward biases a further diode D4 so as to bias a pnp transistor Q3 to its non-conducting state. The result is a low-voltage output of a voltage divider R5 and R6, and this low voltage prevents transistor Q4 from conducting. The resultant high voltage at the collector of transistor Q4 keeps transistor Q5 turned off and thereby isolates the gate of transistor Q1 from the lower "rail" 18 while permitting conduction through transistor Q6. Transistor Q6 thus provides a path from the high "rail" 16 through resistor R4 and transistor Q6 to the gate of transistor Q1, which accordingly conducts.

Similar circuitry causes transistor Q2 to conduct. There is thus very little potential difference between ground and the drain of transistor Q1, so the voltage across the series combination of capacitors C1 and C2 is nearly zero.

To turn transistors Q1 and Q2 off and thus open the switch, the signal at the common gating terminal 12 assumes a low, disablement value and thus allows the voltage across resistor R3 to drop low enough to turn on transistor Q3. The resultant voltage output from voltage divider R5 and R6 turns on transistor Q4, whose resultant low collector voltage reverses the states of capacitors Q5 and Q6 so that the base of Q1 now becomes isolated from the upper "rail" 16 and has its gate-to-source charge drawn off by transistor Q5. Transistor Q1 thus stops conducting.

By a similar mechanism, transistor Q2 also turns off, so capacitors C1 and C2 are allowed to charge rapidly. The junction of capacitors C1 and C2 is connected to that of transistors Q1 and Q2 so that the switch voltage is divided evenly between the transistors if the capacitances of capacitors C1 and C2 are equal. Consequently, no individual transistor is required to withstand the total switch voltage.

As capacitor C2 charges, the voltage at the lower "rail" 18 rises rapidly above those at the gating and supply terminals 12 and 14. However, diodes D1 and D3 isolate the power and gating terminals 14 and 12 from this high voltage, while capacitor C3 keeps the upper "rail" 16 at the level required to provide the necessary bias voltages for the various devices in the illustrated gate circuitry. The transistors thus remain non-conducting until the gating signal again assumes its activation value.

A couple of observations are in order concerning the circuitry of FIG. 3. The first is that the switch transistor circuit within dashed lines 19 is a four-terminal device; in addition to the control and power terminals—i.e., the base of transistor Q3 and the gate and drain of transistor Q1—circuit 19 includes a supply terminal ("rail" 16) to receive power to provide bias voltages. Although this terminal is effectively isolated during the off state of transistor Q1, it must be connected during the on state to recharge capacitor C3.

The second observation is that the relative complexity of the gate circuit not only has the potential for introducing delay but can also introduce differences between the turn-off times of the switch transistors. This can extend the switch turn-off time $t_d$ (FIG. 2c) and thus extend the retrace time and increase timing uncertainty.

SUMMARY OF THE INVENTION

The present invention is a flyback circuit in which the transistor circuits that form the switch are simple three-terminal devices. Specifically, each transistor circuit, or module, includes two power terminals and a control terminal but no fourth terminal by which to apply bias voltage to the circuitry within the module.

In the case of FET embodiments, for instance, the power terminals are the transistor source and drain terminals, and the control terminal is connected to the transistor gate terminal. In addition to the transistor, the module needs to include only a turn-off circuit connected between the gate and the source to aid in turning the transistor off rapidly when the gating signal assumes is disabling value.

All the modules are connected to a common gating terminal, and this connection is provided, in the case of at least all of the modules but one, through a diode oriented to conduct in the direction required to convey an activation signal from the common gating terminal. The diode prevents current flow in the other direction, however, so it isolates the common gating terminal from the high switch voltages that can prevail when the switch is open.

BRIEF DESCRIPTION OF THE DRAWINGS

These and further features and advantages of the present invention are described in connection with the accompanying drawings, in which.

DETAILED DESCRIPTION OF ILLUSTRATIVE EMBODIMENTS

Figure 1:
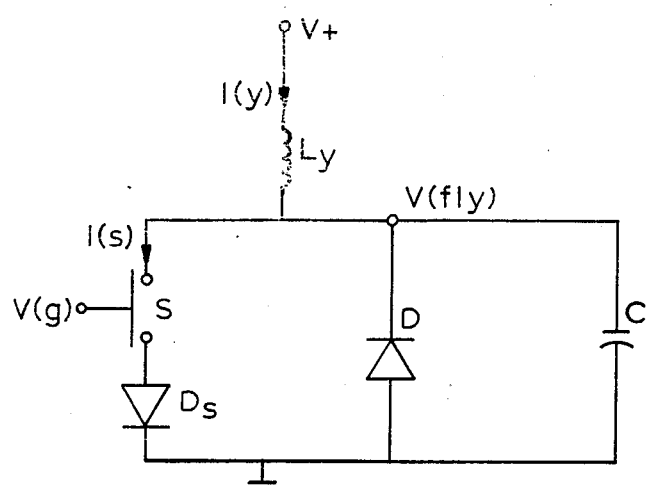
FIG. 1 is a schematic diagram of a simplified version of a conventional flyback circuit.
Figure 4:
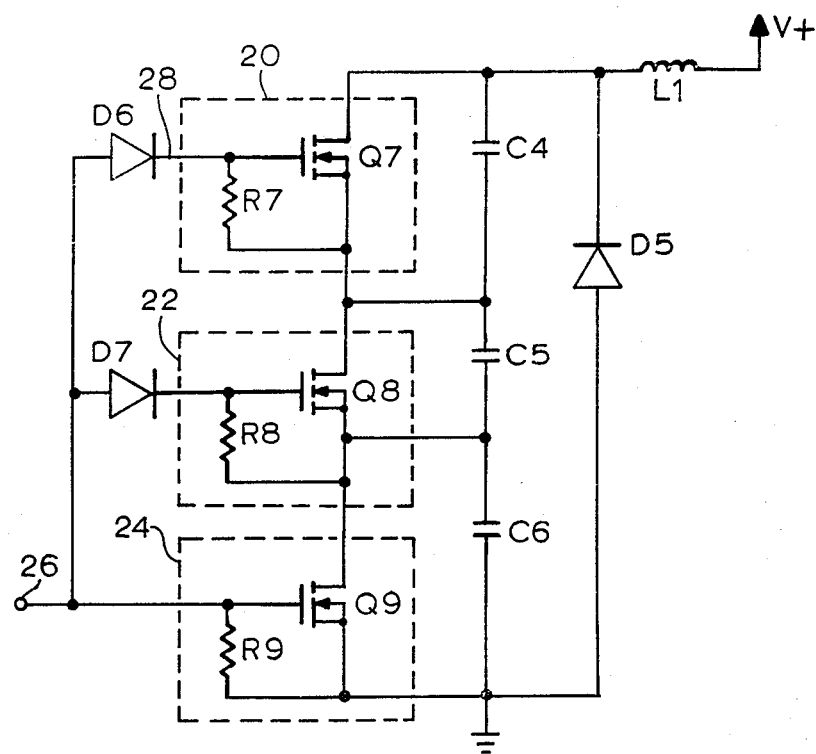
FIG. 4 is a schematic diagram of one embodiment of the present invention.

FIG. 4 depicts a deflection circuit in which the capacitor C of FIG. 1 is embodied in a series combination of three capacitors C4, C5, and C6, and the switch S is embodied in a series combination of three FETs Q7, Q8, and Q9 and associated circuitry. The switch includes three identical transistor-circuit modules 20, 22, and 24. Module 22 is connected to a common gating terminal 26 by means of a diode D6, while module 22 is similarly connected by means of another diode D7. Module 24 is connected directly to the common gating terminal 26 without the interposition of a diode. Although the drawings depict an arrangement that includes three modules, the concept of the present invention is equally applicable to two, four, or more modules.

Figure 3:
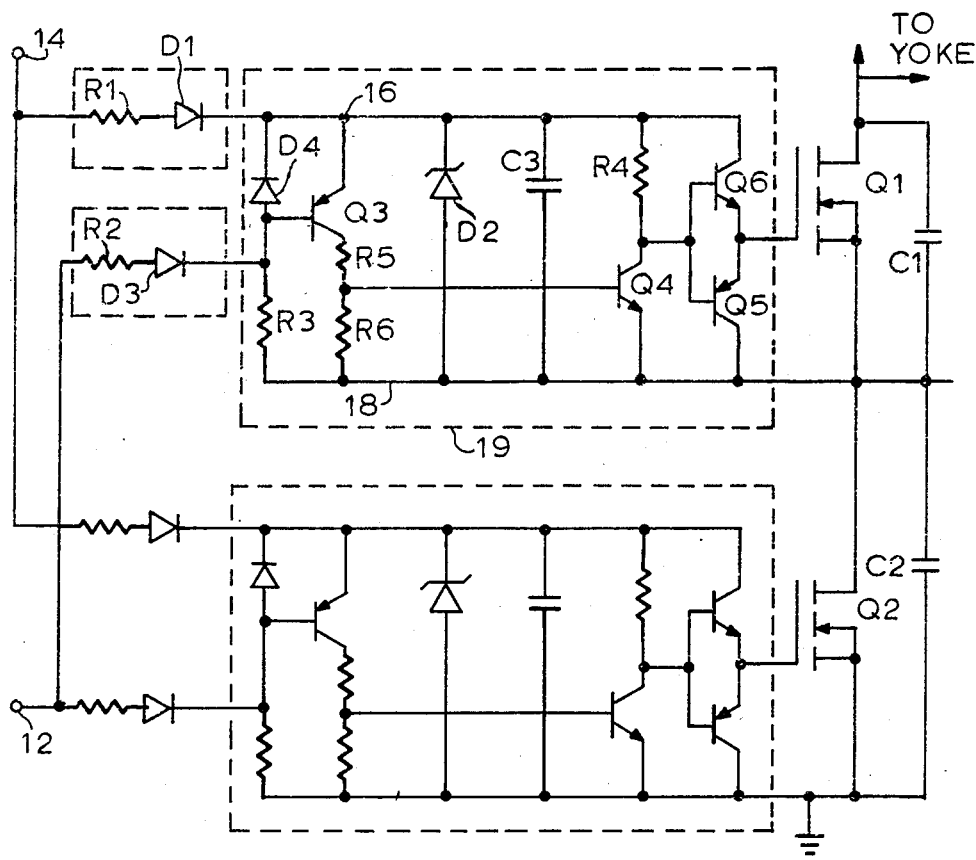
FIG. 3 is a schematic diagram of an exemplary prior-art switch for a flyback circuit.
Figure 2A:
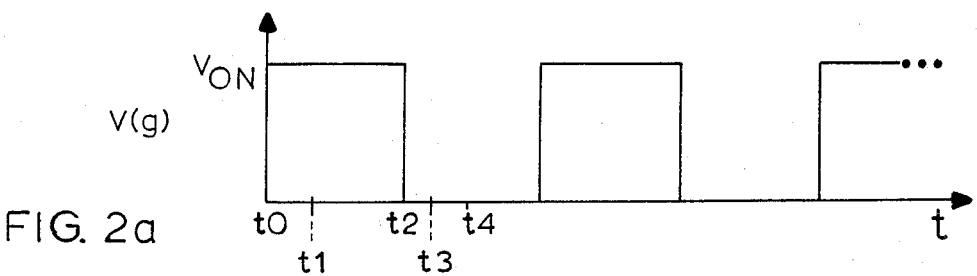
FIGS. 2a–d depict waveforms at various points in the circuit of FIG. 1.
Figure 2B:
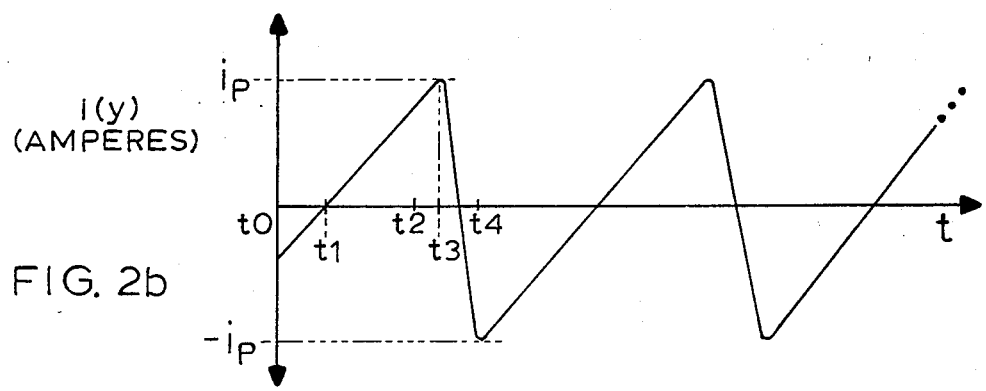
Figure 2C:
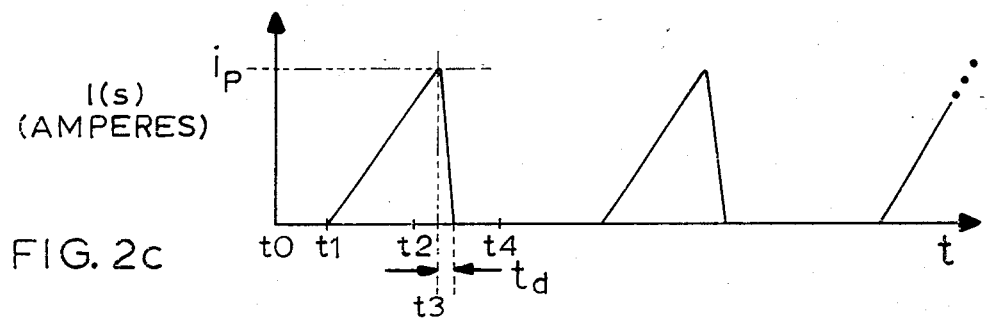
Figure 2D:
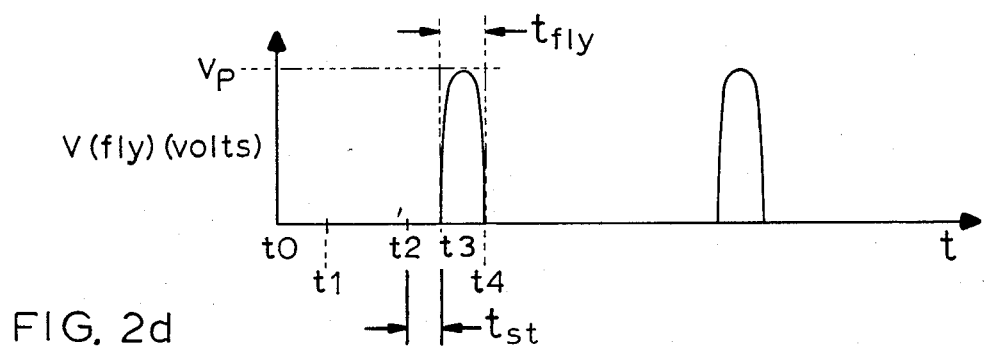

Each of the modules 20, 22, and 24 is a simple three-terminal device. In the case of module 20, for instance, the two power terminals are the gate and drain terminals of Q7, while the control terminal is on the node 28 to which diode D6 is connected. Unlike the circuit of FIG. 3, that of FIG. 4 requires no fourth terminal to provide bias voltages for the gate circuitry of transistors Q7, Q8, and Q9. Moreover, each module is very simple in design so that delay and variations in turn-on time are easily minimized.

In operation, an activation voltage of, say, 10 volts is applied to the common gating terminal 26 to keep the transistors turned on and the switch closed. Specifically, the activation voltage at the gate of transistor Q9 causes it to conduct, so the source terminal of transistor Q8 is approximately at ground potential. The activation signal at terminal 26 accordingly forward biases diode D7, causing current to flow through a resistor R8 and apply a turn-on voltage to the gate of transistor Q8. Therefore, the voltage at the source of transistor Q7 is also near ground, so transistor Q7 also conducts, and the switch is thus open.

To turn the transistors off and thus open the switch, the voltage at terminal 26 is returned to a low level, approximately ground. The charge on the gate-to-source capacitance of transistor Q7 initially keeps it turned on, but a fast-turn-off resistor R7 provides a path for rapidly dissipating the charge on this capacitance so that transistor Q7 quickly stops conducting. By a similar mechanism, transistors Q8 and Q9 also turn off, and capacitors C4, C5, and C6 therefore charge in the manner described in connection with FIG. 1.

The potential at the source terminal of transistor Q7 thus rises to a high level, as does that of the control terminal 28 of module 20, but the reverse bias of diode D6 isolates the common gating node of 26 from this high voltage. Diode D7 performs a similar function in isolating common gating terminal 26 from the high voltages in module 22. A similar diode is not necessary for module 24, because the gate voltage of transistor 29 does not rise as capacitors C4, C5, and C6 charge.

As was discussed in the background in connection with FIGS. 2a-d, the switch is to be closed again after the capacitors C4, C5, and C6 have been discharged. Accordingly, the source terminals of transistors Q7, Q8, and Q9 are nearly at ground potential at this time, so the activation potential at their gates causes them to conduct. The switch is thus closed again.

An activation voltage at terminal 26 would cause the switch to close even if a high voltage were present across the switch. In such a situation, the activation voltage, although not initially high enough to turn on transistors Q7 and Q8, would turn on transistor Q9 so that capacitor C6 would discharge. The voltage at the source terminal of transistor Q8 would therefore drop to a value low enough to permit the activation potential to turn on transistor Q8. By a similar mechanism, transistor Q8 would cause transistor Q9 to conduct.

Figure 5:
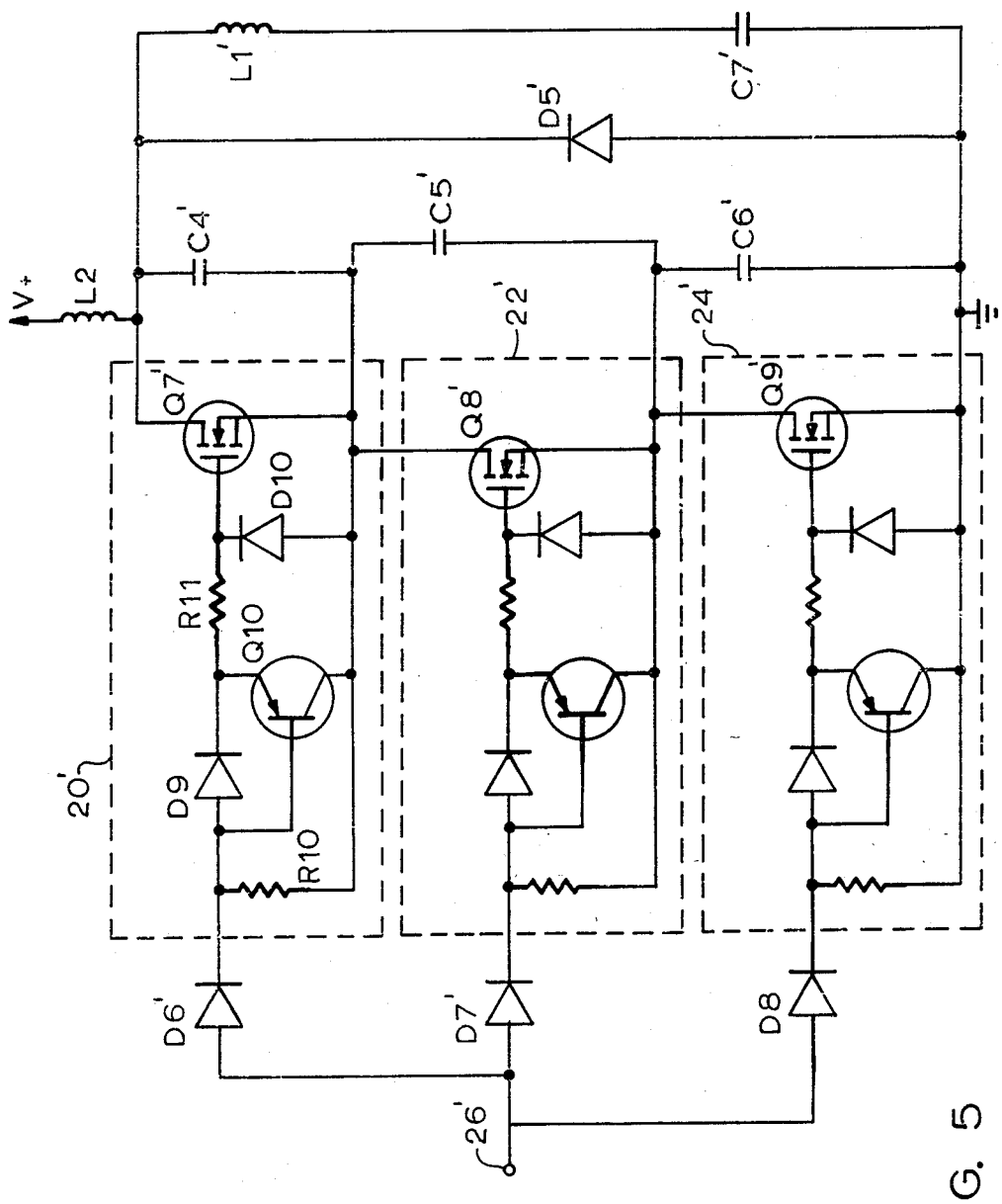
FIG. 5 is a schematic diagram of an alternate embodiment of the present invention.

FIG. 5 is an alternate embodiment of the present invention. The arrangement of FIG. 5 includes components L1', D5', C4', C5', and C6', whose functions are the same as those of the corresponding unprimed components in the arrangement of FIG. 4. However, the connections to yoke L1' in the circuit of FIG. 5 are similar to those in most conventional circuits and differ from those to yoke L1 in the simplified circuit of FIG. 4. The purpose of the difference is to modify the shape of the current curve during the forward trace. Rather than the strictly liner curve illustrated in FIG. 2b, the yoke current of the circuit of FIG. 5 follows a curve that tapers somewhat near the ends so as to overcome display distortions that would otherwise be introduced by the geometry of the CRT.

For this purpose, the fixed V+ voltage source of FIG. 4 is replaced with a large capacitor C7 whose average voltage is maintained by a fixed V+ voltage source acting through a choke coil L2. Capacitor C7 performs a function similar to that of the fixed source of FIG. 4, but its voltage increases in response to the negative yoke current during the first half of the horizontal trace and decreases in response to the positive yoke current during the second half so that the rate of charge of the yoke current is less at the ends of the trace than it is in the middle of the trace.

The inductance of the choke coil L2 is high enough that it can be considered an a.c. open circuit. Aside from its function of maintaining an average voltage on capacitor C7, therefore, the voltage source V+ can be considered isolated from the circuit. The operation of yoke circuit of FIG. 5 is thus the same as that of the FIG. 1 circuit except for the shape of the yoke-current curve during the forward trace. Accordingly, the operation of this part of the circuit of FIG. 5 will not be separately described.

Like the embodiment of FIG. 4, that of FIG. 5 includes three transistor modules 20', 22', and 24'. Like the corresponding modules of FIG. 4, these modules receive their gating signal from a common gating terminal 26', although, for reasons of interchangeability, the arrangement of FIG. 5 includes an additional diode D8 to provide the connection between module 24' and the common gating terminal 26. As will become apparent as the description proceeds, the difference between the modules 20', 22', and 24' of FIG. 4 is that the fast-turn-off resistors R7, R8, and R9 of FIG. 4 are replaced with fast-turn-off circuits that present less load to the gating-signal source.

With an activation voltage at the common gating terminal 26', transistors Q7', Q8', and Q9' conduct, so the source terminal of Q7' is nearly at ground potential. Diode D6' is thus forward-biased to permit current flow through a bias resistor R10. This results in a voltage at the base of a pnp transistor Q10 that forward biases a bias diode D9 so as to prevent conduction through pnp transistor Q10. The cathode voltage of diode D9 is thus two diode drops below the activation potential at terminal 26', and this voltage appears at the gate of transistor Q7' and keeps it conducting. Transistors Q8' and Q9' similarly conduct, so the voltage across the capacitor circuit comprising capacitors C4', C5', and C6' is held to zero.

To open the switch, the signal at the common gating terminal 26' is lowered approximately to ground, and diode D6 is accordingly back biased. Because of the gate-to-source capacitance of transistor Q7', its gate initially remains at the voltage required to keep it conducting. However, because the activation voltage no longer drives the upper side of resistor R10 to a high level, transistor Q10 can conduct and thus provide a current path through a current-limiting resistor R11 to ground. The source-to-drain capacitance Q7' thus discharges rapidly, and transistor Q7' quickly stops conducting. Transistors Q8' and Q9' are turned off in a similar manner, so the switch opens.

From the foregoing description, it can be appreciated that transistor Q10 and bias resistor R10, together with the resistor R11 and diode D9 in the activation-signal path from diode D6' to the gate of transistor Q7', act as a fast-turn-off circuit in place of the fast-turn-off resistor R7 of FIG. 4. The reason for using transistor Q10 in place of resistor R7 of FIG. 4 is to reduce the current drawn from the gating source when the switch is held closed. The resistance of resistor R7 of FIG. 4 should be small so as to enable Q7 to discharge rapidly. However, this low resistance also draws substantial current from the gating-signal source when the switch is closed. In the arrangement of FIG. 5, resistor R10 does conduct when the switch is closed, but its resistance can be much higher than that of resistor R7; when the switch opens, resistor R10 needs to conduct only a small fraction of the current required to discharge the Q7 source-to-drain capacitance rapidly.

The purpose of the current-limiting resistor R11 is to set the discharge current that transistor Q10 draws. Clearly, transistor Q10 would draw less current in the absence of resistor R11, but it is desirable to have transistors Q7', Q8', and Q9' discharge at the same rate and thus turn off simultaneously, and it is easier to match the resistances of R11 and corresponding resistors in the other modules 22' and 24' than to match the characteristics of transistor Q10 with those of its corresponding turn-off transistors in the other modules.

In order to protect transistor Q7' from any possible damaging reverse voltage, a diode D10 is connected between the gate and the source of transistor Q7' to prevent such reverse voltages between the gate and the drain.

By employing the teachings of the present invention, it is possible to perform flyback-circuit switching through the use of a switch whose individual transistor-circuit modules are controlled by a common gating signal and require no separate bias-voltage supply terminal. It is thus apparent that the present invention constitutes a significant advance in the art.

I claim:

1. A cathode-ray-tube deflection circuit comprising:
A. a cathode-ray-tube deflection yoke;
B. a capacitance circuit connected to the yoke to form a resonant circuit therewith;
C. a voltage source connected across the series combination of the yoke and the capacitor circuit;
D. a switching circuit comprising:
  i. a common gating node for carrying a gating signal;
  ii. a plurality of switch modules connected in a series combination thereof across the capacitor circuit, each switch module including only three module terminals, the three module terminals being first and second power terminals and a control terminal, each switch module comprising:
    (a) a transistor, including a transistor control terminal and a pair of transistor power terminals serving as the module power terminals, for conducting current between the transistor power terminals when a predetermined activation signal is present at the transistor control terminal and for preventing current from flowing between the transistor power terminals when a predetermined disabling signal is present at the transistor control terminal; and
    (b) an activation-signal path for conveying an activation signal from the module control terminal to the transistor control terminal; and
  iii. connection means associated with each of the modules, each connection means connecting its associated module to the common gating terminal, at least each connection means but one comprising diode means, providing the sole connection between the module and the gating terminal and being oriented to conduct current in the direction necessary to convey the activation signal from the common gating terminal to the module control terminal but prevent current conduction in the opposite direction.

2. A deflection circuit as defined in claim 1 wherein the transistor is a field-effect transistor, the power terminals are the source and drain thereof, and the control terminal is the gate thereof.

3. A deflection circuit as defined in claim 2 further including a fast-turn-off circuit, connected between the gate and the source of the transistor, for depleting charge on the capacitor when the disabling signal is present.

4. A deflection circuit as defined in claim 3 wherein:
A. the activation-signal path includes a bias diode; and
B. the fast-turn-off circuit also includes the bias diode and further includes:
  i. a second transistor including a control terminal and a pair of power terminals, the power terminals of the second transistor being connected respectively to the source and gate of the first-mentioned transistor, the bias diode being connected between one of the power terminals of the second transistor and the control terminal of the second transistor; and
  ii. a bias resistor connected between the control terminal of the second transistor and the other power terminal of the second transistor.

5. A deflection circuit as defined in claim 4 wherein the fast-turn-off circuit further includes a current-limiting resistor in the activation path, the current-limiting resistor providing the connection between the gate of the first transistor and one of the power terminals of the second transistor so as to control the rate at which the second transistor dissipates the charge on the first transistor.

6. A deflection circuit as defined in claim 2 wherein each switching circuit additionally includes a diode connected between the source and the gate of the transistor in such an orientation as to prevent significant reverse voltages between the source and the gate.

7. A cathode-ray-tube deflection circuit comprising:
A. a cathode-ray-tube deflection yoke;
B. a capacitance circuit connected to the yoke to form a resonant circuit therewith;
C. a voltage source connected across the series combination of the yoke and the capacitor circuit;
D. a switching circuit comprising:
  i. a common gating node for carrying a gating signal;
  ii. a plurality of switch modules connected in a series combination thereof across the capacitor circuit, each switch module including only three module terminals, the three module terminals being first and second power terminals and a control terminal, each switch module comprising:
    (a) a field-effect transistor, including a gate terminal and source and drain terminals serving as the module power terminals, for conducting current between the source and drain terminals when a predetermined activation signal is present at the transistor control terminal and for preventing current from flowing between the source and drain terminals when a predetermined disabling signal is present at the gate terminal;
    (b) an activation-signal path control for conveying an activation signal from the module control terminal to the gate terminal, the module-control path including a bias diode and a current-control resistor connected to the gate terminal of the field-effect transistor; and
    (c) a fast-turn-off circuit, connected between the gate and the source of the transistor, for depleting charge on the capacitor when the disabling signal is present, the fast-turn-off circuit comprising the bias diode, the circuit-control resistor, a bipolar transistor whose base-emitter junction is connected across the bias diode, whose collector is connected to the source of the field-effect transistor, and whose emitter is connected through the current-control resistor to the gate of the field-effect transistor, and a bias resistor connected between the base and collector of the bipolar transistor; and
  iii. connection means associated with each of the modules, each connection means connecting its associated module to the common gating terminal, at least each connection means but one comprising diode means providing the sole connection between the module and the gating terminal and being oriented to (a) conduct current in the direction necessary to convey the activation signal from the common gating terminal to the module control terminal but (b) prevent current conduction in the opposite direction.

* * * * *